United States Patent [19]

Ruhrmann

[11] Patent Number: 4,650,992
[45] Date of Patent: Mar. 17, 1987

[54] OPTICAL SENSOR CONSTITUTING A LIGHT TRANSMISSIVE MEDIUM WITH LUMINESCENT PARTICLES

[76] Inventor: Wolfgang Ruhrmann, Herrenberger Strasse 24, 7000 Stuttgart 80, Fed. Rep. of Germany

[21] Appl. No.: 563,672
[22] Filed: Dec. 20, 1983
[30] Foreign Application Priority Data
Dec. 23, 1982 [DE] Fed. Rep. of Germany ....... 3247659
[51] Int. Cl.$^4$ .......................... G01D 5/26; G02B 6/00
[52] U.S. Cl. ............................... 250/227; 250/231 R; 250/231 P; 250/486.1; 250/577; 73/293
[58] Field of Search ............... 250/227, 231 R, 231 P, 250/577; 356/249; 250/486.1, 357.1; 350/96.1, 96.34; 73/293

[56] References Cited
U.S. PATENT DOCUMENTS
4,443,699  4/1984  Keller .................................. 250/227
4,569,570  2/1986  Brogardh et al. ................. 250/486.1

Primary Examiner—Edward P. Westin
Attorney, Agent, or Firm—Erwin S. Teltscher; Peter R. Ruzek

[57] ABSTRACT

An optical sensor is made of light transmissive material and has luminescent particles distributed throughout its volume. The luminescent particles are excited by a suitable type of energy, preferably light. As they return to their original state, they emit light uniformly in all directions. Depending upon the relationship of the index of refraction of the sensor body material to that of a test medium abutting a boundary surface of the sensor body, part of the luminescent light is reflected, the remainder passing into the test medium with a change in direction (refraction). When the test medium is optically less dense than the sensor medium luminescent light incident on the boundary surface at an angle exceeding the critical angle undergoes total reflection. For an elongated sensor body, this totally reflected part is transmitted to the end faces of the sensor, where its intensity constitutes a desired measure of a physical quantity. The sensor is effective for any physical characteristic which can change the index of refraction of the surrounding medium or that of the sensor itself. In addition, the quantity of totally reflected light can be varied also by changing the quantity of primary light applied to the sensor. Possible applications of a sensor of this type include measurements of liquid level in a container, the measurement of concentrations of a given component in a solution, temperature and pressure measurements of gases, monitoring of the boiling point of a liquid at very low temperatures, measurements of humidity, and a variety of position and length measurements. The sensor can also be used as a unit in a keyboard.

36 Claims, 16 Drawing Figures

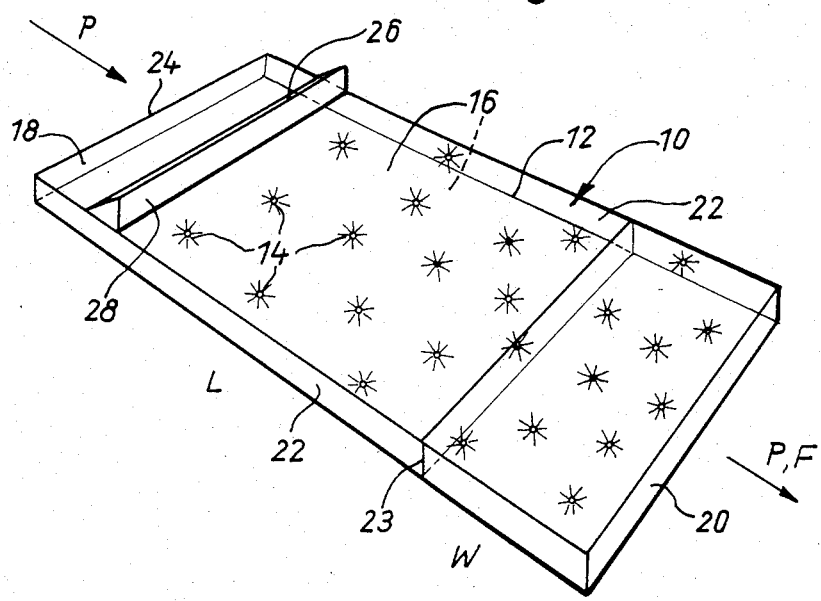
Fig. 1
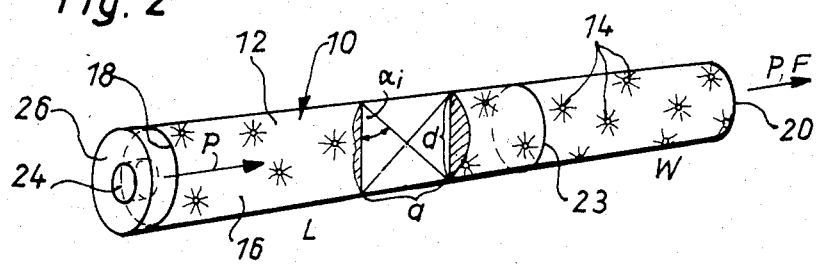
Fig. 2
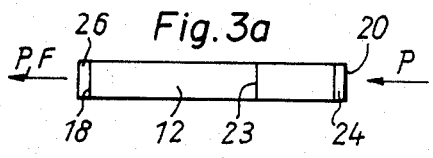
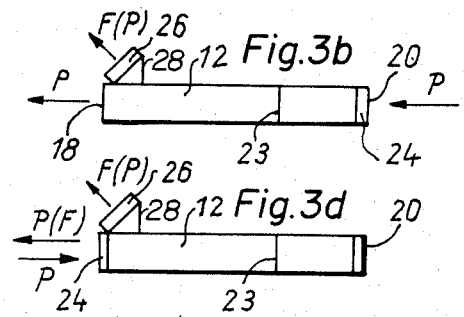
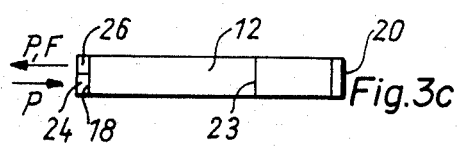
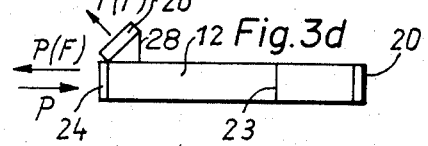
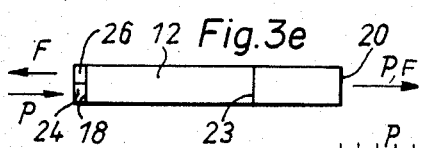
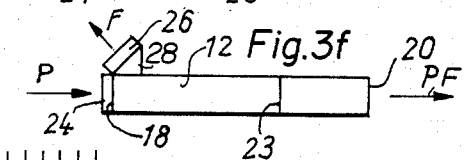
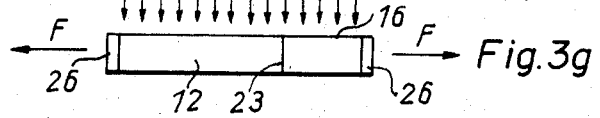

OPTICAL SENSOR CONSTITUTING A LIGHT TRANSMISSIVE MEDIUM WITH LUMINESCENT PARTICLES

FIELD OF THE INVENTION

The present invention relates to optical sensors for measuring or control systems, as well as a number of applications of such sensors.

BACKGROUND OF THE INVENTION

The advent of digital circuits has caused great progress to be made in measurement and control equipment in the last few years. Such digital circuits require an increased number of more accurate and versatile sensors for physical quantities of all types. The development of digital systems coincides with the introduction of optical fibers and the optoelectronic transmitting and receiving elements associated therewith. The advantages of such systems are well known: They include a wide bandwidth, electrical isolation, relative insensitivity to electric noise, the ability to withstand extreme temperature changes and explosive or corrosive environments, low weight and small space requirements.

If a conventional electronic sensor is used, a transducer must be supplied which changes the electrical output signal of the sensor into an optical signal. The optical signal is then transmitted through the fiber to an indicator or to the control unit. It must then be converted back to an electronic signal. Thus there must be at least two transducing stages. To eliminate this need and to improve the accuracy, linearity and stability of measurement, it is desirable to have sensors which immediately translate the quantity to be measured into a suitable light signal.

SUMMARY OF THE INVENTION

It is an object of the present invention to furnish an optical sensor which operates directly to furnish optical signals indicative of the quantity to be measured. Particularly, the quantity to be measured should affect the refractive index or light transmittance of a test medium or of the sensor itself.

In accordance with the present invention, a sensor element is made of a refracting medium having a predetermined index of refraction and comprising a multiplicity of particles distributed through the sensor. The particles radiate secondary energy, such as light in response to excitation by primary energy, such as a primary light furnished by a primary light source. The sensor element has a boundary surface which is at least in part transmissive to the secondary light energy. The boundary surface is coupled to a test medium having a refractive index which is different or essentially dissimilar from the refractive index of the sensor element. The sensor element radiates the secondary light energy at an output location and receives the incident light at an incident light location. The primary light may be applied as continuous light beam or may be applied as pulsed light.

The invention makes use of the physical principle that luminescent particles homogeneously distributed throughout an optical body will radiate light uniformly in all directions when energized. If a test medium is optically coupled to a light transmissive boundary surface of the sensor body, the luminescent light radiated internally of the body will be partially reflected at the boundary surface in accordance with the law of reflection and may be partially refracted in the test medium, with a change of direction. If the light is transmitted from an optically denser into a less dense medium, it is refracted away from the perpendicular to the boundary. If the angle of incidence exceeds a critical angle at which the refracted beam will move parallel to the boundary surface of the sensor body, total reflection occurs. The light emitted by the particles will, in an elogated sensor body be transmitted to the end faces of the body only when its incident angle at the light transmissive boundary surface exceeds the critical angle for total reflection. If this critical angle is exceeded, half of the totally reflected light will be transmitted to one of two end faces of the sensor. The rest of the secondary light will be transmitted through the boundary surface into the neighboring test medium.

The intensity of the secondary light which appears in a cross sectional region, and in particular in a cross section near one of the end faces of the sensor thus constitutes a quantity which is readily measurable and which varies with any one of a number of different physical quantities which it is desired to measure or control. In particular, this type of sensor will respond to stepwise variations in the refracting index of the test medium along the boundary surface of the sensor. This effect is particularly strong, if, at a predetermined position along the body of the sensor, a transition from a medium which is optically less dense than the sensor medium to a medium which is optically denser than the sensor medium takes place. In the area in which the optically denser test medium abuts the boundary region, almost all of the secondary light generated within the sensor will pass from the body of the sensor. Thus, by coupling an optically denser test medium to the boundary surface, a separation of the secondary light emitted in different regions of the sensor body can take place. Measurement of the intensities of the light from the different regions can then result, after further signal processing, in a usable measurement or control signal.

In a preferred embodiment of the invention, the secondary energy is either a fluorescent or a phosphorescent energy resulting from radiation with light or ultraviolet radiation. The choice of sensor material can then include those materials which are usable as fluorescent collectors. For most applications, the sensors have an elongated cylindrical, plate shaped or foil shaped body whose cross sectional dimensions are small relative to their length. The superficies or major surfaces of the sensor body then constitute the light transmissive boundary surface to which the test medium is optically coupled.

The intensity of the primary light source should be such that the majority of the flourescent or phosphorescent particles in the sensor body are excited. Pulse excitation is also possible, and may be particularly useful where extraneous noise is present. Here too a majority of the available fluorescent particles should be energized or excited. Light may be applied to the sensor and transmitted from the sensor by means of optical fibers. Transducing the optical signals into electrical signals can be accomplished with any of the conventional photoreceivers, for example a photodiode, a phototransistor a photoresistor or any other photo element.

In order to prevent any interference with the measured signal by the primary light, the incident light location at which the primary light is aplied and the output location at which the measurement of the secondary light takes place may be at the same end of the sensor body, while the end face at the other extreme of the sensor body is light transmissive. The output location and the incident light location may be arranged side by side or coaxially to one another. Alternatively, the output location may be an area on the boundary surface, a prism or grating at said location causing the output light to be transmitted onward.

The sensor according to the present invention may be used in many applications. A few of these are briefly described herein. In all of the applications, a variation of the refracting index as a function of time or space in a test medium optically coupled to the sensor is used in order to effect a variation of intensity of the secondary light received at the output lo- cation.

In particular, the apparatus according to the present invention may be used to furnish a measure of the height of liquid in a container, of the concentration of a substance in liquid or organic solutions, of pressure and temperature variations in gases, measurement of the percentage of components in a mixture, boiling point monitoring, for example at low temperatures, determination of humidity, rain forecasting, switches, keys, key fields, balances, etc.

Another way of changing the intensity of the secondary light received at the output location may be to vary the applied primary light by blocking it to a greater or lesser degree from the incident light location. When operating according to this principle, the sensors according to the present invention are independent of the index of refraction of the surrounding medium. This type of apparatus is particularly useful for carrying out measurements of the height of liquid in a container. Further, when an electrically controllable light blocker is used in the path of light incident on the sensor, an electro-optical signal transformation is simply achieved. For this purpose, a liquid crystal region, electrically controllable and positioned between two polarizers which are either in parallel or perpendicular to one another may be used.

The novel features which are considered as characteristic for the invention are set forth in particular in the appended claims. The invention itself, however, both as to its construction and its method of operation, together with additional objects and advantages thereof will best be understood from the following description of specific embodiments when read in connection with the accompanying drawings.

BRIEF DESCRIPTION OF THE DRAWING

FIG. 1 is a schematic diagram illustrating a plate-shaped optical sensor for measuring the liquid level in containers.

FIG. 2 illustrates a cylindrical optical sensor for measuring liquid levels;

FIGS. 3(a)-3(g) illustrate sensor embodiments having different incident light and output locations;

DESCRIPTION OF THE PREFERRED EMBODIMENTS

Figure 4:
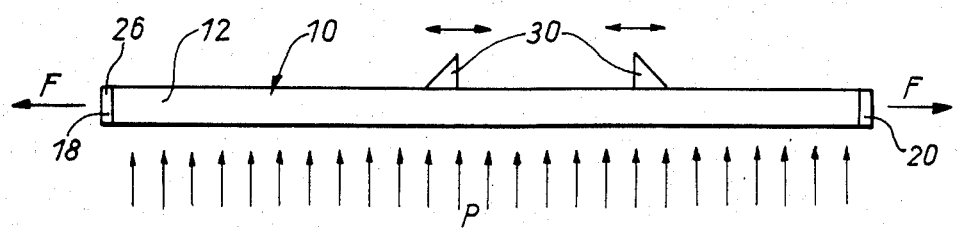
FIG. 4 is an arrangement for position measurement with an optical sensor.

Referring now to FIG. 1, sensor 10 consists of an optical body 12 made of a light transmissive material. Luminescent particles 14 (luminophores) are distributed throughout the volume as homogeneously as possible. The luminescent particles are excited by means of radiation with light, ultraviolet, x-rays, gamma or corpuscular beams, or, alternatively, by chemical processes, through the application of electric fields or electrical discharge processes. They emit light, infrared or ultraviolet radiation when returning to their orginal state. In the sensors to be described below, only fluorescence or phosphorescence resulting from excitation by light or ultraviolet radiation is discussed, even though the remaining types of luminescence could also be used. It is only required that the light from the totality of the luminescence particles is emitted equally in all directions.

The sensor body 12 has a light transmissive boundary surface 16. The index of refraction of the sensor body is $n_i$. Optically coupled to this surface is a test medium L and/or a second medium W. For an index of refraction $n_a$ of one of these media, the light emitted by the particles (herein referred to as the secondary light) is partially reflected at the boundary surface 16 in accordance with the law of reflection and is partially refracted into the medium L or W with a change in direction according to Snell's law. In accordance with the law of refraction:

$$n_i \times \sin \alpha_i = n_a \times \sin \alpha_a,$$

where $\alpha_i$ and $\alpha_a$ respectively signify the incident angles relative to the perpendicular within the sensor body (i) and in the test or second medium (a).

If light travels from an optically denser into an optically less dense medium ($n_a$ less than $n_i$), then the light is refracted from the perpendicular. Total reflection occurs when the incident angle exceeds a critical angle $\alpha t$ at which $\alpha_a = 90°$. At this point:

$$\sin \alpha_t = n_a/n_i.$$

Sensor body 12 has two end faces 18 and 20. The light emitted by the particle is transmitted to these end faces only when the incident angle at the light transmissive boundary surface 16 exceeds the critical angle. All other secondary light is transmitted through the boundary surface into medium L or W after a relatively short distance of the order of magnitude $$a = d \times \tan \alpha_t,$$

where d is the diameter or the thickness of the wall of sensor body 12. Light transmission thus occurs only when the test or second medium is optically less dense than the sensor medium.

The secondary light is emitted equally in all directions and, in a suitable sensor material, is not absorbed to any great extent. Thus, for a given geometry of the sensor body and known indices of refraction of the sensor medium and the test or second medium it is possible to determine the proportion or part of the secondary light generated within the sensor body which will reach the end faces 18 and 20. For an elongated cylindrical rod, this proportion or part is given by the following equation:

$$\epsilon_z = 1 - \sin \alpha_t.$$

The suffix "z" refers to a cylindrical part.

For an elongated plate-shaped body having plane parallel boundary surfaces 16 and mirrored longitudinal side faces 22 the part of the total radiated light reaching the end surface will be:

$$\epsilon_p = \cos \alpha_t.$$

The suffix "p" refers to a plate.

Half of this amount will be transmitted to each of the end faces 18 and 20. The rest of the secondary light radiated within the sensor will be transmitted through boundary surface 16 into adjacent medium L or W.

The above equations when the sensor medium is optically denser than the test or second medium. In all other cases, to a first approximation $$\epsilon = 0$$

where "$\epsilon$" denotes that part of the luminescent light which at a given reflection angle $\alpha$ reaches the sensor end-faces 18 or 20, respectively. That is, no secondary light will reach the end faces. In deriving this equation, the light which is internally generated directly in the axial direction of sensor body 12 has been neglected. This approximation is better the longer the sensor body in relationship to its cross-sectional dimension d.

The intensity of light in a cross-sectional region, and, particularly, close to the end faces 18 and 20 of sensor body 12 is a readily measurable quantity which, dependent on the application, may constitute a measure for any one of a number of parameters. This intensity can, for example, vary in dependence on changes in the index of refraction of the sensor medium on the one hand and the adjacent test or second medium on the other hand. In particular, abrupt changes in index of refraction of the medium adjacent to sensor body 12 can readily be determined.

The effect is particularly pronounced when, at a particular place along sensor body 12, a transition 23 from a medium that is optically less dense than the sensor medium to one that is optically more dense takes place. In the region bordering the optically denser medium W, almost all of the secondary light generated within sensor body 12 which reaches the boundary surface will pass through to the adjacent medium. Secondary radiation generated in a particular region of sensor body 12 can thus be separated from that generated in other regions by optical coupling of an optically denser second or comparison medium to the boundary surface. Measurements of the intensity of secondary light received from a particular location is thus indicative of the index of refraction of the medium adjoining the boundary surface at that location. This will be explained in greater detail with a few practical examples.

The embodiments illustrated in FIGS. 1 and 2 illustrate optical sensors 10 which are particularly useful to determine the liquid level in a container. The sensor 10 of FIG. 1 has an elongated plate or foil shaped body, while that of FIG. 2 is cylindrical. Both sensors are transparent and have fluorescent particles which are distributed throughout their volume. A luminescent or laser diode constitutes a primarily light source P which provides light at an incident light location 24. The light has such an intensity and wave length, that the majority of the fluorescent particles 14 within the sensor body are excited and emit light. Further, the sensor has an output location 26. Fluorescent secondary light which reaches this location is applied to a photoreceiver. Photodiodes, phototransistors, photoresistors or other photo elements may be used. These transduce the incoming optical signals into electrical signals which are then further processed in a conventional manner before application to a display or a control unit.

The sensor has one end which is immersed in liquid W, one part of the sensor extending above liquid level 23. Incident light location 24 for primary light P as well as the output location 26 for secondary light F are located in the end 18 of the sensor which is not immersed in the fluid. This end is thus in an optically less dense second medium as, for example, air L. End face 20 of the sensor, which is immersed at the lowest point of the container, is light transmissive. Thus any primary light P which is not utilized for exciting the particles will leave sensor 10 without interference. Any secondary light which is refracted above the critical angle (total reflection) will also appear at lower end face 20 of the sensor. The totally reflected light which is reflected upwards is transmitted from the sensor to the photoreceiver by either a prism 28 or a grating. With this type of arrangement, excess primary light P, even if of high intensity, does not interfere with the measuring process since it leaves at the lower end face 20, and therefore never reaches the output location.

A stepwise change of index of refraction takes place at the liquid level 23. If the intensity of primary light P remains constant, the intensity of secondary light arriving at output location 26 will depend on the height of the liquid level 23. The light intensity at output location 26 is thus a measure for the liquid level in the container.

If the index of refraction $n_i$ of sensor body 12 is less than that of liquid W, then almost no secondary light from the immersed region of the sensor reaches the output location, since the secondary light created in that region is almost completely transmitted into liquid W. Thus the secondary light arriving at output location 26 will be derived almost exclusively from the non-immersed portion of the sensor if it is assumed that for this nonimmersed portion the index of refraction of the second medium (air) is less than that of the sensor itself. Theoretically, a measurement is also possible when the index of refraction of liquid W is less than that of the sensor medium, but larger than that of air. It is true that in that case part of the secondary light generated in the immersed portion of the sensor will also reach output location 26 by total reflection. However, since the critical angle for the immersed region is smaller than that of the corresponding part of the non-immersed region, a correlation between the liquid level and an intensity change of the secondary light received at output location 26 will result.

For the cylindrical sensor illustrated in FIG. 2, the incident light location 24 for primary light P and output location 26 for connection of the photoreceiver are arranged coaxially to one another at end face 18. Since the other end face 20 is light transmissive, here too only that part of the secondary light will reach output location 26 which is emitted in a direction opposite the direction of travel of primary light P and is totally reflected at the cylindrical boundary surface 16.

FIG. 3(a) through 3(g) illustrate a number of variations of the placement of incident light locations 24 and output locations 26.

In the embodiments illustrated in FIGS. 3(a) and 3(b), primary light P is applied at end face 20 in the region of the denser test medium W. The output location 26 is at the opposite end face, end face 18. For the embodiment of FIG. 3(a), primary light P and the secondary light F to be measured both reach output location 26, while for FIG. 3(b) most of primary light P leaves at the light transmissive end face 18, while only a smaller portion is transmitted by prism 28 at output location 26, together with the secondary light. Additionally processing must then be provided for separating the two light components. This will not be explained in detail here.

The same is true for the embodiments illustrated in FIG. 3(c) and 3(d). In these embodiments, incident light location 24 and output location 26 are arranged at the same end of the sensor, but end face 20 is mirrored, allowing at least part of excess primary light to be reflected to the output location.

A substantial improvement is effected by the embodiments of FIGS. 3(e), (f) and (g). In these arrangements, the excess primary light does not reach output location 26. In the embodiment of FIG. 3(e), incident light location 24 and output location 26 are situated next to each other at one end face of the sensor, while the other end face, end face 20, is transmissive for the primary light and any secondary light which reaches this location. In the embodiment of FIG. 3(f) the primary light is also applied at end face 18 and then leaves at end face 20 together with any secondary light which reaches the latter, while the secondary light emitted in the opposite direction is transmitted by a prism 28.

In the embodiments illustrated in FIG. 3(g), the primary light is applied in a direction perpendicular to the lengthwise direction of the sensor through the major surface 16 thereof and leaves the body of the sensor at the opposite major surface. For this embodiment, output locations 26 for the secondary light can be provided at both end faces of the sensor, since no primary light reaches these faces.

FIG. 4 shows an embodiment of a measuring arrangement for a position or length measurement. A prism 30 is mounted for lengthwise movement relative to an elongated optical sensor 10. The length of the base abutting sensor body 12 should correspond at least to $a = d \times \tan \alpha_t$, where $\alpha_t$ is the critical angle of refraction of sensor body 12 relative to the surrounding air. The secondary light is transmitted outward through the hypothenuse surface of prism 30, so that the directional dependence of the outgoing light can be maintained. Incident light P can be applied at one of the end faces 18 or 20 or, as illustrated in FIG. 4, it may be applied to the major surface 16 of the sensor body. Output locations 26 for the secondary light are preferably arranged at the end faces 18 and 20 of the sensor body. The intensity of light arriving at output locations 26, as well as the relationship or difference between them constitute a measure of the position of the prisms relative to one another and to the output locations.

Figure 5:
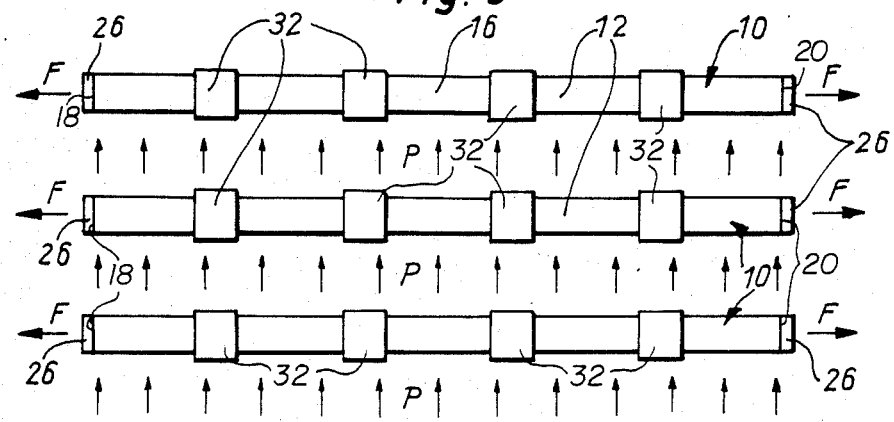
FIG. 5 is a keyboard with a plurality of optical sensors.
Figure 6:
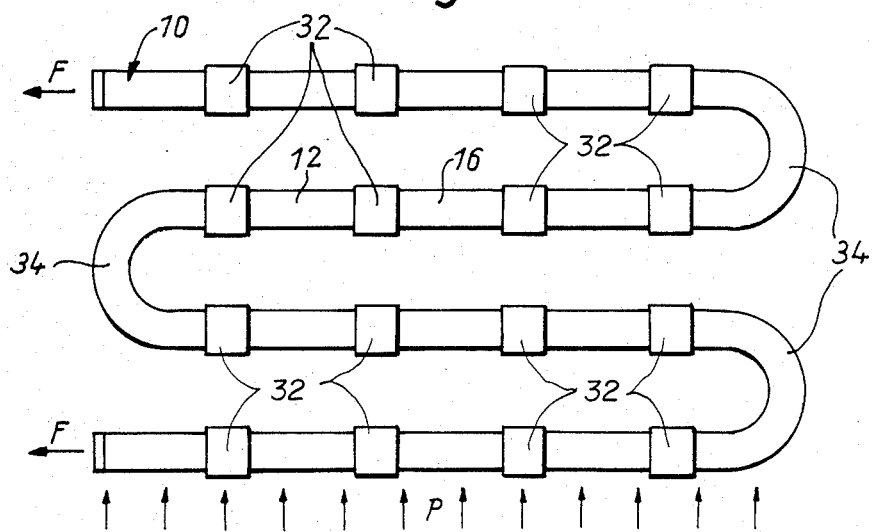
FIG. 6 is a schematic diagram of an alternate embodiment of a keyboard.

The keyboards illustrated in FIGS. 5 and 6 make use of the above-mentioned principle, namely that by coupling an optically denser receiver to the sensor it is possible to couple out all the secondary light which is generated in the region concerned and which arrives at the output location. The requirement again exists that the base surface which abuts the boundary surface must extend over a length of $a = d \times \tan \alpha_t$, where $\alpha_t$ is the critical angle of refraction in the sensor body relative to the adjoining optically less dense second medium (air), while d is the thickness or the diameter of the sensor body.

In the embodiments illustrated in FIGS. 5 and 6, the sensor body 12 is an elongated light conducting body on which the individual keys 32 are arranged at predetermined distances from one another. The keys 32 are connected to the above-mentioned photoreceivers which are pressed against the light transmissive boundary surface 16 of sensor body 12 when keys 32 are activated. The light reaching output locations 26 at end faces 18 and 20 is momentarily weakened by a defined amount in accordance with the then present activated key. Intensity measurements at each of the two output locations 26 can therefore determine whether, and possibly which, of keys 32 are depressed. Further, a comparison of the measurement results at the two output locations or a forming of the sum of the two results can determine whether two keys are depressed simultaneously. Any overlap in time of the depression of two keys can be eliminated, since it is always possible to determine which key was pressed first and which was activated last.

In the embodiment of FIG. 5, a plurality of sensor bodies 12 each having a separate output location or locations 26 is used for each group of keys. In the embodiment of FIG. 6, a single elongated sensor body 12 having a number of light conductive curves 34 is provided for the complete key field. In each case, primary light P is incident over the major surface 16 of sensor body 12, so that no primary light reaches output locations 26.

Figure 8:
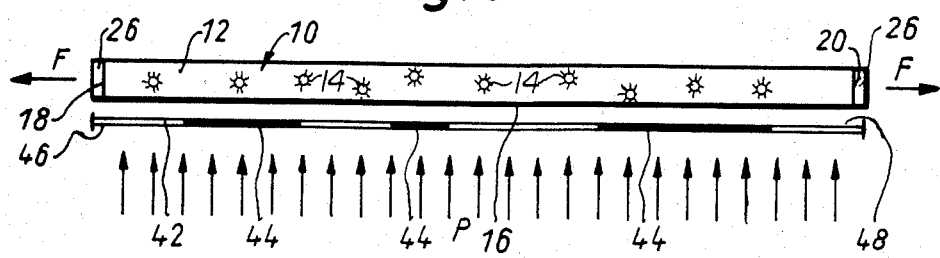
FIG. 8 illustrates a sensor arrangement with an LCD light blocker.
Figure 7:
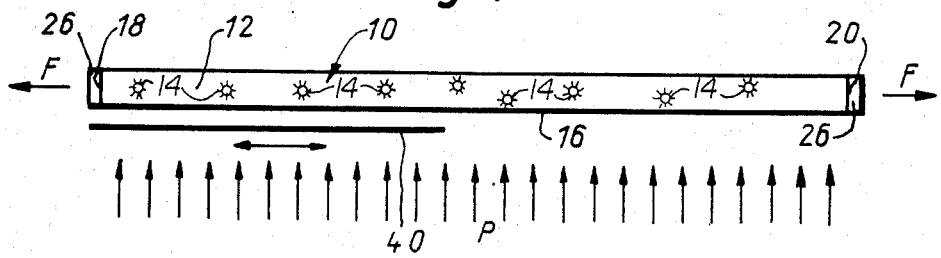
FIG. 7 is a sensor arrangement utilizing the light blocking principle.

The sensor arrrangements illustrated in FIGS. 7 and 8 operate by the blockage of primary light. Sensor 10 consists of a rod like or plate shaped body 12 of light transmissive material, in which luminescent particles 14 are homogeneously distributed throughout the volume. Excitation of the particles is achieved by primary light P, which is applied perpendicular to the lengthwise direction of the sensor via its major surface 16. The primary light leaves the sensor body on the oppositely located major surface. The secondary light is received at end faces 18 and 20. In the path of the primary light, a light blocking apparatus 40 is provided which has at least one opaque region 44. The size of the opaque region is variable and may be varied by the parameter to be measured, for example the liquid level in a container. Depending upon the size of the opaque surface, more or less particles are excited in the body of the sensor, so that the light intensity received at output locations 26 is a measure for the size of the opaque surface and therefore for the quantity to be measured.

In the embodiment illustrated in FIG. 8, the blocking apparatus 42 is a liquid crystal arrangement consisting of two polarizers 46 and 48 and a liquid crystal layer between the two polarizers. The liquid crystal layer is divided into a number of regions 44 which are separately controllable, so that the light transmissive quality of the light blocking apparatus can be varied over its surface. The light intensity measured at the ends of the sensor body is thus a measure for the effective transmissivity of the liquid crystal diode light blocking apparatus.

Figure 9:
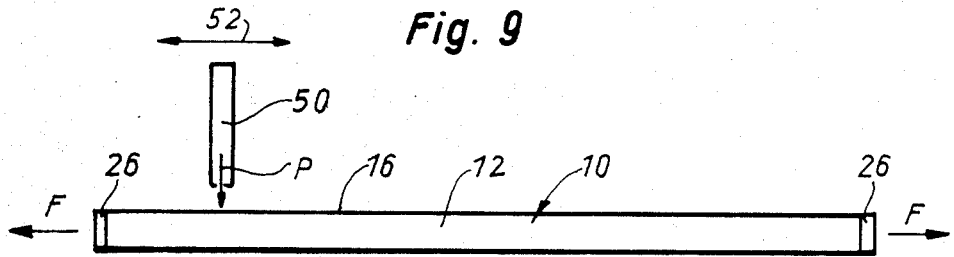
FIG. 9 is a schematic diagram of apparatus operating by luminescent light absorption and having a moveable primary light source.
Figure 10:
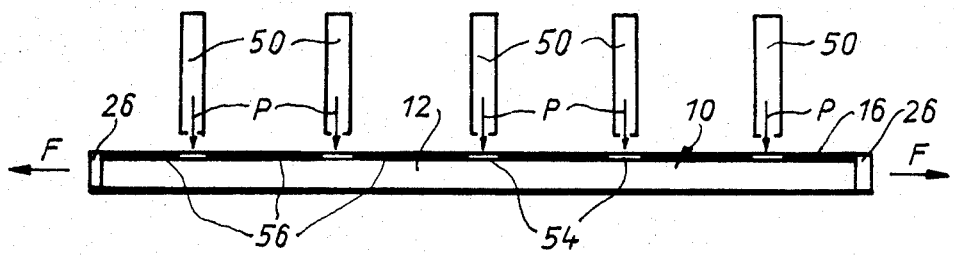
FIG. 10 is a schematic diagram of an absorption system utilizing a plurality of fixed primary light sources.

In the embodiments of FIGS. 9 and 10, the decrease in intensity of the luminescent or secondary light because of light absorption between its place of origin and output locations 26 is used to determine the relative position of primary light source 50 along the elongated sensor body. Here, primary light sources 50 emit a bundled primary light beam P, which impinges on the entry or incident surface 16 in a direction perpendicular to the lengthwise direction of sensor body 12. To conduct position measurements, for example in a machine tool, primary light source 50 and sensor body 12 may be moveable with respect to one another, as is indicated by the double arrow 52 in FIG. 9.

In the embodiment shown in FIG. 10, a plurality of primary light sources 50 are arranged at predetermined distances with respect to one another along sensor body 12. To prevent the introduction of extraneous light, the incident surface 16 of the sensor body is provided with a plurality of light transmissive windows 54 facing primary light sources 50, while the regions 56 between windows 54 are opaque. Primary light sources 50, singly or in combination generate a defined intensity of luminescent or secondary light at the measurement locations which allow the position of the primary light to be determined.

Two test set-ups for the present invention will now be described. For the first, 5 mg of the fluorescent dye eosin having the chemical composition $C_{20} H_6 Br_4 Na_2 O_5$ were dissolved in a liter of water. A glass tube having one closed end, an outer diameter of approximately 5 mm, a wall thickness of approximately 0.75 mm and a length of 225 mm was filled with this solution and used as a sensor body. A phototransistor type PE BPW 16N (manufacturer AEG-Telefunken) was arranged in such a manner that its window faced the end face of the sensor body. The phototransistor was fastened to the tube with black opaque tape, which sealed the transistor end of the sensor body, including the phototransistor, from lateral light. A sheet having millimeter markings was placed on the board and both ends of the sensor body fastened to the board in such a way that an opaque tube, closed at one end, could be moved relative to the sensor body so that differing lengths were exposed to the primary light. Diffused daylight falling on the elongated side of the sensor body was used as a primary light source. The arrangement corresponded approximately to the embodiment of FIG. 7, in which a single phototransistor is arranged at the right end of the sensor body.

A DC source of 9 volts in series with a reference resistor of 220K ohms was connected in the emitter-collecter circuit of the phototransistor. A digital voltmeter was used to read the voltage developed across the reference resistor as a function of the length of sensor body exposed to the primary light. The following readings resulted:

| Exposed length (mm) | 0 | 20 | 40 | 60 | 80 | 100 | 120 | 140 | 160 | 200 |
|---|---|---|---|---|---|---|---|---|---|---|
| Voltage (mv) | 0 | 81 | 150 | 210 | 260 | 305 | 329 | 340 | 353 | 379 |

Clearly, the voltage measured by the digital voltmeter i.e. a fluorescent light dependent voltage, varies clearly and sensitively as a function of the length of the sensor body exposed to the primary light.

In a second experiment, the opaque cover was removed and, in a darkened room, incandescent light was applied to the lengthwise dimension of the sensor body at different distances from the phototransistor. As primary light source, an incandescent lamp with lens and a slit shaped diaphragm was used. The diaphragm was 2 mm broad in the lengthwise direction of the sensor body and 20 mm long in a direction perpendicular thereto. The sensor body was the same as that used in the previous example. This test arrangement corresponds to the embodiment of FIG. 9 which utilizes only one output location. The following measurements resulted:

| Distance (mm) | 10 | 25 | 40 | 55 | 70 | 85 | 100 | 115 | 130 | 160 |
|---|---|---|---|---|---|---|---|---|---|---|
| Voltage (mv) | 265 | 117 | 67 | 38 | 25 | 15 | 9 | 6 | 4 | 2 |

As expected, the output voltage, corresponding to the fluorescent light received at the output location, varied substantially exponentially with respect to the distance from the output location of the applied primary light.

While the invention has been described with reference to specific embodiments, it is not to be limited to the features thereof since many variations and modifications will readily occur to one skilled in the art. Such modifications and changes are therefore to be considered encompassed in the following claims.

I claim:

1. Apparatus for measuring the value of a predetermined characteristic, comprising in combination
   a source of primary energy,
   a test medium having a test index of refraction,
   a sensor element made of a refracting medium having a predetermined index of refraction essentially dissimilar from said test index of refraction, and including a multiplicity of particles distributed therethrough for radiating secondary energy in the form of light in response to excitation by said primary energy,
   said sensor element having a boundary surface at least in part transmissive to said secondary energy, and being coupled to said test medium, and
   an output location receiving a part of said secondary energy, said secondary energy varying as a function of the value of said predetermined chracteristic,
   secondary energy receiving means coupled to said sensor element at said output location, and
   an optical comparison medium optically coupled to said boundary surface of said sensor element, said comparison medium being optically less dense than said test medium, and less dense than said refracting medium,
   said output location being arranged at said boundary surface adjacent to said comparison medium.

2. Apparatus as set forth in claim 1 wherein said primary energy is light energy.

3. Apparatus as set forth in claim 2, wherein said light source is a laser diode.

4. Apparatus as set forth in claim 2, wherein said light energy is intensity modulated.

5. Apparatus as set forth in claim 1, wherein said sensor element has an elongated cylindrical body having a superficies comprising said boundary surface.

6. Apparatus as set forth in claim 5, wherein said sensor element is an optical fiber.

7. Apparatus as set forth in claim 1 wherein said sensor element has a plate-shaped body having a major surface comprising said boundary surface.

8. Apparatus as set forth in claim 1, wherein said test medium is a fluid, and wherein said predetermined characteristic of said test medium is the height of said fluid in a container,
   wherein said comparison medium which is optically less dense than said fluid, and less dense than said refractive medium of said sensor element, extends over said fluid in said container,
   wherein said sensor element has a light transmissive boundary surface having a first part immersed in said fluid, and a second part immersed in said comparison medium,
   wherein said secondary energy receiving means includes a photoreceiver responsive to the intensity of secondary light arranged in proximity to said second part of said boundary surface, and
   wherein said source of primary energy is a light source.

9. Apparatus as set forth in claim 8, wherein said fluid is optically denser than said refracting medium of said sensor element.

10. Apparatus as set forth in claim 1, wherein said test medium is optically denser than said refracting medium of said sensor element.

11. Apparatus as set forth in claim 1, wherein said particles are luminescent particles.

12. Apparatus as set forth in claim 11, wherein said luminescent particles are fluorescent.

13. Apparatus as set forth in claim 11, wherein said particles are phosphorescent.

14. Apparatus as set forth in claim 12, wherein said source of primary energy is a luminescent diode.

15. Apparatus as set forth in claim 1 wherein said sensor element is an elongated body having a predetermined length and a first and second end face extending in a direction perpendicular to said predetermined length; and
   wherein said source of primary energy is a light source arranged at said first end face and said secondary energy receiving means is a photoelectric receiver arranged at said second end face.

16. Apparatus as set forth in claim 1 wherein said sensor element is an elongated body having a predetermined length and a major surface including said predetermined length, said major surface having a entry area for transmitting light; and
   wherein said source of primary energy is a light source emitting light toward said entry area.

17. Apparatus as set forth in claim 1, wherein said secondary energy receiving means comprises a photoreceiver.

18. Apparatus as set forth in claim 17, further comprising photoconducting means connecting said photoreceiver to said output location.

19. Apparatus as set forth in claim 1, wherein said refracting medium of said sensor element is light transmissive.

20. Apparatus as set forth in claim 19, wherein said light transmissive medium is glass.

21. Apparatus as set, forth in claim 19, wherein said light transmissive medium is plastic.

22. Apparatus as set forth in claim 19, wherein said light transmissive medium is a tube filled with a fluid.

23. Apparatus as set forth in claim 19, wherein said light transmissive medium is a gas-filled cylindrical tube.

24. Apparatus as set forth in claim 1, wherein said test medium comprises a plurality of keys arranged along the length of said sensor element at predetermined distances from one another, made of an optically denser material than said refracting medium of sensor element and arranged to abut said boundary surface when depressed;
   wherein said sensor element has a first and second end face; and
   wherein said secondary energy receiving means comprises a photoreceiver arranged at one of said end faces.

25. Apparatus as set forth in claim 1, wherein said sensor element is an elongated body having a predetermined length, a major surface including said predetermined length, and a first and second end face extending in the direction perpendicular to said predetermined length; and
   wherein said output location is on said major surface and said source of primary energy is a light source arranged at said first end face.

26. Apparatus as set forth in claim 1, wherein said sensor element is an elongated body having a predetermined length, and a first and second end face extending in a direction substantially perpendicular to said predetermined length; and wherein said source of primary energy and said secondary energy receiving means are coupled to said first end face.

27. Apparatus as set forth in claim 26, wherein said source of primary energy is a light source; and
   wherein said second end face is light transmissive.

28. Apparatus as set forth in claim 1, wherein said predetermined index of refraction of said sensor element varies as a function of a physical parameter.

29. Apparatus as set forth in claim 28, wherein said physical parameter is a pressure change.

30. Apparatus as set forth in claim 28, wherein said physical parameter is a temperature change.

31. Apparatus as set forth in claim 28, wherein said physical parameter is a change in concentration of a dissolved substance.

32. Apparatus as set forth in claim 1, wherein said predetermined characteristic of said test medium is the index of refraction of a liquid or a gas and wherein said sensor element is at least partly immersed in said liquid or said gas and has an index of refraction adapted to be varied in correspondence to the index of refraction of said liquid or said gas.

33. Apparatus as set forth in claim 32, wherein said refracting medium of said sensor element is a solution having a controllable concentration of the dissolved substance.

34. Apparatus as set forth in claim 32, wherein said refracting medium of said sensor element comprises a gas having an adjustable pressure.

35. Apparatus as set forth in claim 32, wherein said sensor element is a solid having a refractive index variable as a function of applied pressure.

36. Apparatus as set forth in claim 32, wherein said sensor element has a refractive index increasing along the length of said sensor element and matching said refractive index of said fluid or gas in at least one location.

* * * * *